United States Patent [19]
Hong

[11] Patent Number: 6,008,089
[45] Date of Patent: Dec. 28, 1999

[54] METHOD OF FABRICATING A SPLIT GATE FLASH MEMORY DEVICE

[75] Inventor: Gary Hong, Hsinchu, Taiwan

[73] Assignee: United Semiconductor Corp., Hsinchu, Taiwan

[21] Appl. No.: 09/033,376

[22] Filed: Mar. 2, 1998

[30] Foreign Application Priority Data

Dec. 24, 1997 [TW] Taiwan ................................. 86119670

[51] Int. Cl.[6] ................................................. H01L 21/336
[52] U.S. Cl. .......................... 438/259; 438/257; 438/266; 438/305
[58] Field of Search ................................... 438/259, 263, 438/264, 266, 278, 301, 305, 306, 307, 524, 530, 589

[56] References Cited

U.S. PATENT DOCUMENTS

| | | | |
|---|---|---|---|
| 4,272,302 | 6/1981 | Jhabvala | 438/307 |
| 4,295,924 | 10/1981 | Garnache et al. | 438/589 |
| 5,141,886 | 8/1992 | Mori | 438/259 |
| 5,180,680 | 1/1993 | Yang | 438/259 |
| 5,270,257 | 12/1993 | Shin | 438/589 |
| 5,424,231 | 6/1995 | Yang | 438/524 |
| 5,460,987 | 10/1995 | Wen et al. | 438/589 |
| 5,514,607 | 5/1996 | Taneda | 438/259 |
| 5,567,635 | 10/1996 | Acovic et al. | 438/259 |
| 5,583,066 | 12/1996 | Jung | 438/259 |
| 5,610,091 | 3/1997 | Cho | 438/259 |
| 5,773,343 | 6/1998 | Lee et al. | 438/259 |
| 5,854,501 | 12/1998 | Kao | 438/259 |
| 5,874,346 | 2/1999 | Fulford, Jr. et al. | 438/524 |
| 5,882,972 | 3/1999 | Hong et al. | 438/524 |

*Primary Examiner*—Charles Bowers
*Assistant Examiner*—Jack Chen
*Attorney, Agent, or Firm*—Merchant & Gould P.C.

[57] ABSTRACT

A method of fabricating a split gate flash memory. A substrate is provided for implantation with first ions to form a source region in the substrate. Second ions are implanted into the substrate to form a drain region in the substrate, wherein the source region is connected to the drain region. A part of the substrate is defined to form a number of trenches, wherein the trenches are located between the source region and the drain region. A tunneling oxide layer is formed along the profile of the trenches and on the surface of the substrate. The trenches are subsequently filled with a first polysilicon layer, wherein the depth of the first polysilicon layer is between that of the source region and that of the drain region in the substrate. An inter-dielectric layer is formed over the surface on the substrate and the first polysilicon layer, and a second polysilicon layer is formed on the substrate. The second polysilicon layer, the inter-dielectric layer, and the first poysilicon layer are defined to complete the fabricating of the flash memory device.

13 Claims, 3 Drawing Sheets

METHOD OF FABRICATING A SPLIT GATE FLASH MEMORY DEVICE

CROSS-REFERENCE TO RELATED APPLICATION

This application claims the priority benefit of Taiwan application serial no. 86119670, filed Dec. 24, 1997, the full disclosure of which is incorporated herein by reference.

BACKGROUND OF THE INVENTION

1. Field of the Invention

The invention relates in general to the fabrication of a flash memory device, and more particularly to a split gate flash memory device and method of fabricating the same.

2. Description of the Related Art

A nonvolatile memory is now widely used in electronic devices. For example, it is used for storing structure data, program data, and re-access data. For the programmable nonvolatile memory, the electrically erasable programmable ROM (EEPROM) is more used and is widely applied in personal computers and other electronic equipment. The conventional EEPROM is a transistor with a floating gate. Even though the EEPROM can be written to, be erased, and store data, it still has the defect of a low accessing rate, whereas the EEPROM with a flash memory device can process at a faster accessing rate.

FIG. 1 shows a cross-sectional view of a conventional flash memory device. The conventional flash memory mainly comprises a floating gate. Referring to FIG. 1, a tunneling oxide 110 is formed on the p-substrate 100. A floating gate 120 is then formed on the tunneling oxide 110, and a controlling gate 140 is formed on the floating gate 120. A dielectric layer 130 forms between the floating gate 120 and controlling gate 140. On the sides of the floating gate 120 and the controlling gate 140, there are oxide spacers 170 to protect the transistor, and there is a n-type drain region 150 and a source region 160 formed under the surface of the semiconductor substrate 100. The flash memory takes on the nature of Fowler-Nordheim tunneling. For example, when the flash memory stores data, a high voltage, on the order of 12 volts, is applied between the source region 160 and the drain region 150. A high voltage is also applied to the controlling gate 140. Hot electrons generated by the source region 160 will flow from the source region 160 toward the floating gate 120 through the tunneling oxide layer 110 near the drain region 150. By this mechanism, the threshold voltage of the floating gate transistor is raised to store data.

When the data is to be erased, a negative voltage is applied to the controlling gate 140. The electrons trapped in the floating gate 120 will tunnel through the tunneling oxide layer 110 to erase the data, and the floating gate 120 comes back to the uncharged state. In the erasing process, the erasing time takes a long time to ensure the uncharged state of the floating gate 120. If the erasing time takes too long, not only do the electrons trapped in the floating gate 120 reflow, but the electrons belonging to the floating gate 120 are also pulled out. When many electrons are pulled out, the floating gate 120 will leave many holes, and the transistor becomes a depletion-type transistor. That is to say, even if no voltage source is applied to the controlling gate 140, the transistor is turned on to cause an over-erased effect.

SUMMARY OF THE INVENTION

It is therefore an object of the invention to provide an improved flash memory with a split gate transistor. When the floating gate of the transistor is erased, the split gate transistor can turn off the flash memory, even if the transistor is over-erased, to become a depletion-type transistor. By doing so, the invention can benefit other memory cells, freeing them from the influences of the over-erased effect.

The invention achieves the above-identified objects by providing a method of fabricating a split gate flash meraory. The method includes at least the following steps. A substrate is provided for implantation with first ions to form a source region in the substrate. Second ions are then implanted on the substrate to form a drain region in the substrate, wherein the source region is connect to the drain region. Next, the substrate is defined to form a number of trenches, wherein the trenches are located between the source region and the drain region. Then, a tunneling oxide layer is formed in the trenches and on the surface of the substrate. The trenches are subsequently filled with a first polysilicon layer, wherein the depth of the first polysilicon layer is between that of the source region and that of the drain region in the substrate. An inter-dielectric layer is formed over the surface of the substrate and the first polysilicon layer, and a second polysilicon layer is formed on the substrate. Finally, the second polysilicon layer, the inter-dielectric layer, and the first polysilicon layer are defined to complete the fabricating of the flash memory device.

The invention achieves the above-identified objects by further providing a split gate flash memory device. The flash memory device includes at least the following structure: a substrate, a first doped region, a second doped region, a number of trenches, a first polysilicon layer, a tunneling oxide layer, an inter-dielectric layer, and a second polysilicon layer. The first doped region and the second doped region are connected and formed in the substrate, wherein the depth of the first doped region is greater than that of the second doped region. The trenches are located between the first doped region and the second doped region. The first polysilicon layer is formed in the trenches, wherein the depth of the first polysilicon layer is between that of the first doped region and that of the second doped region in the substrate. The tunneling oxide is formed between the trenches and the first polysilicon layer. The inter-dielectric layer is formed on the surface of the first polysilicon layer and the substrate. The second polysilicon layer is formed over the inter-dielectric layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

Figure 1:
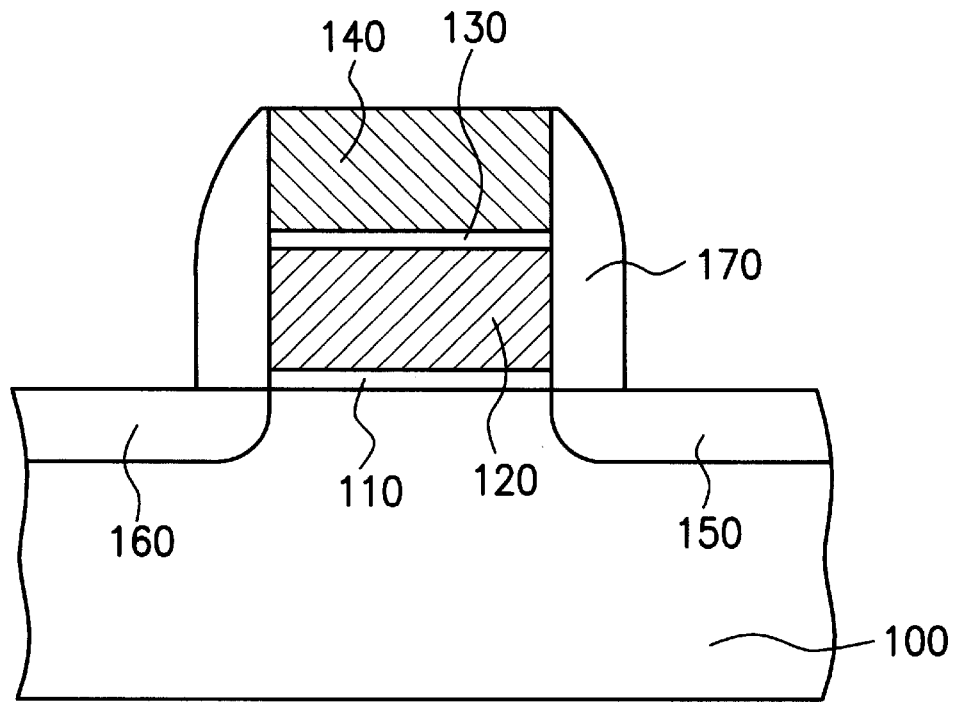
FIG. 1 is a cross-sectional view showing a conventional flash memory device.

| | |
|---|---|
| 100, 200: substrate | 202: mask layer |
| 110, 216: tunneling oxide layer | 206, 206a: first doped region |
| 120: floating gate | 210, 210a: second doped region |
| 130, 220: inter-dielectric layer | 212: photo-resist layer |

-continued

140: controlling gate
150: drain region
160: source region
170: oxide spacer
F: floating part
P: split part 218, 218a: first polysilicon layer
222: second polysilicon layer
D: drain
S: source
G: gate

DESCRIPTION OF THE PREFERRED EMBODIMENT

FIGS. 2A to 2F are cross-sectional views showing the process steps of one preferred embodiment of the method for fabricating a split gate flash memory device.

Figure 2A:
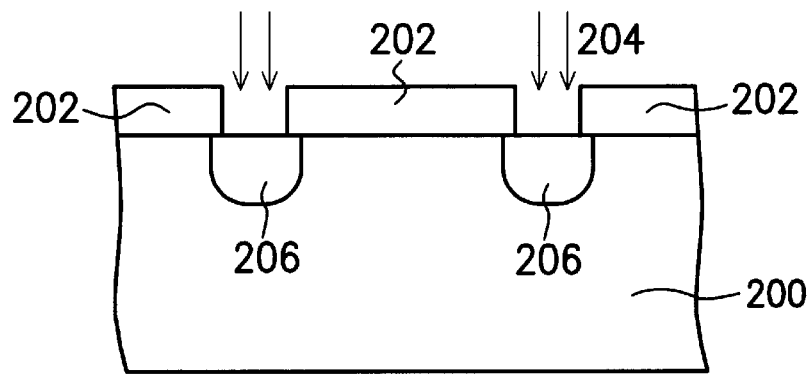
FIGS. 2A to 2F are cross-sectional views showing the process steps of the method for fabricating a split gate flash memory device in accordance with a preferred embodiment of the present invention.

Referring first to FIG. 2A, a mask layer 202 is formed on the substrate 200, so that the mask layer 202 masks part of the substrate 200. The mask layer 202 is, for example, a photoresist layer. Next, the substrate 200 is implanted with first ions. The first ions, for example, phosphorus ions or arsenic ions, are implanted with a dosage of about $10^{13}-5\times 10^{15} cm^{-2}$ and with an energy of about 30–200 KeV on the substrate 200 to form a first doped region 206. The first doped region 206 is a source region. After the implantaion of the first ions, the dopant is driven on the substrate 200 by an annealing process so that the first doped region 206 is even deeper in the substrate. The annealing process continues for 10–60 minutes at a temperature of 850–1000° C.

Figure 2B:
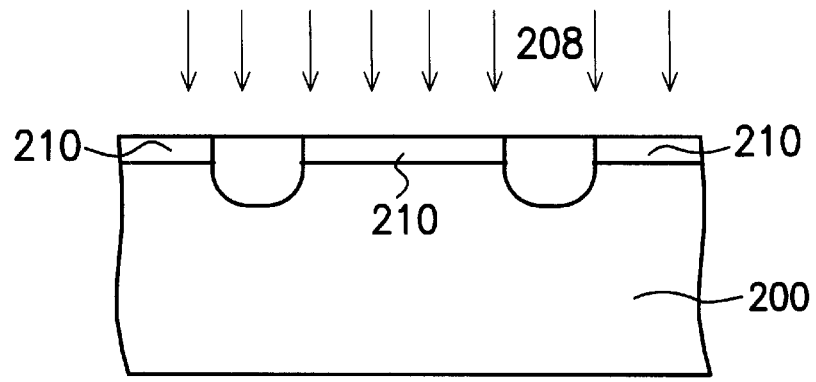

Then, the mask layer 202 is removed, and the substrate 200 is further implanted with second ions. The second ions, for example arsenic ions, are implanted with a dosage of $5\times 10^{14}-5\times 10^{15} cm^{-2}$ on the substrate 200 to form a second doped region 210. The second doped region 210 is a drain region. As shown in FIG. 2B, the first doped region 206 is connected to the second doped region 210, and the first doped region 206 is deeper than the second doped region 210.

Figure 2C:
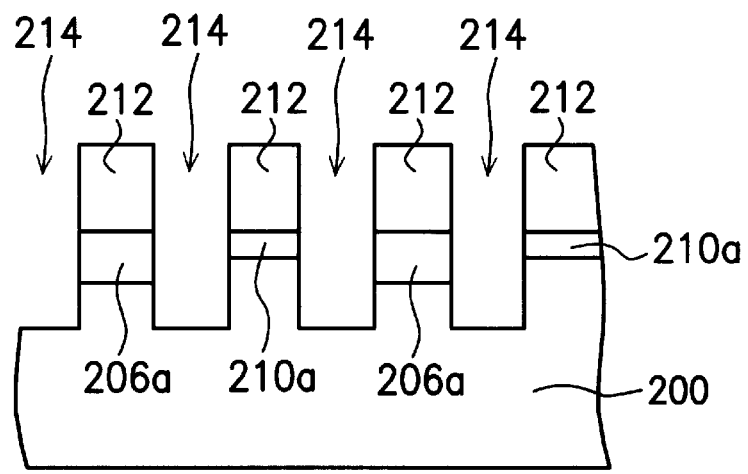

Referring to FIG. 2C, a photoresist 212 is formed on the substrate 200, and the photoresist 212 is patterned to define the substrate 200 and form a plurality of trenches 214. The trenches 214 are located between the first doped region 206a and the second doped region 210a, such that the trenches 214 are deeper than the first doped region 206a. Afterwards, the photoresist 212 is removed.

Figure 2D:
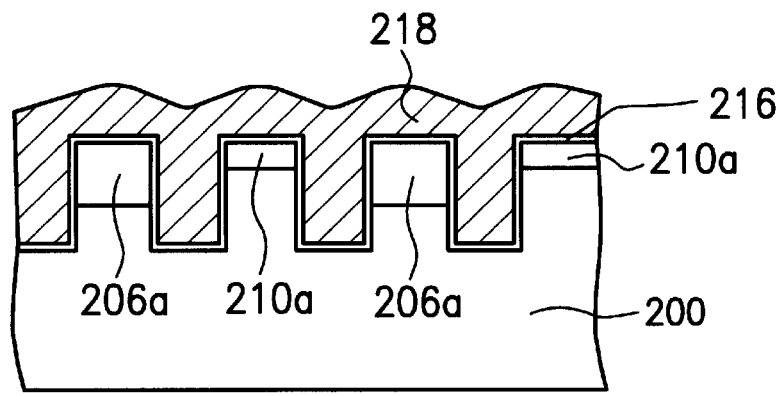
Figure 2E:
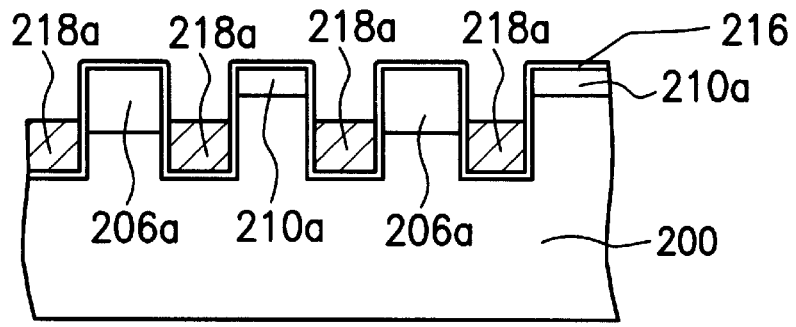

Referring next to FIG. 2D, a tunneling oxide layer 216 is formed on the surface of the trenches 214 and the substrate 200. Since the hot electrons will tunnel through the tunneling oxide layer 216 when the flash memory device is to be programmed or erased, the tunneling oxide layer 216 is, to be thin. The tunneling oxide layer 216 is formed, for example, by thermal oxidation, to a thickness of 50–100 Å. A first polysilicon layer 218 is deposited by LPCVD procedure and doped using in situ doping procedure. The first polysilicon layer 218 fills not only in the trenches 214 but also covers the surface of the substrate 200. Then, the first polysilicon layer 218 is etched back by dry etching to expose the surface of the tunneling oxide layer 216. As shown in FIG. 2E, the surface of the remainder of the first polysilicon layer 218a is located between the first doped region 206a and the second doped region 210a, wherein the first polysilicon layer 218a is the floating gate of the flash memory device.

Figure 2F:
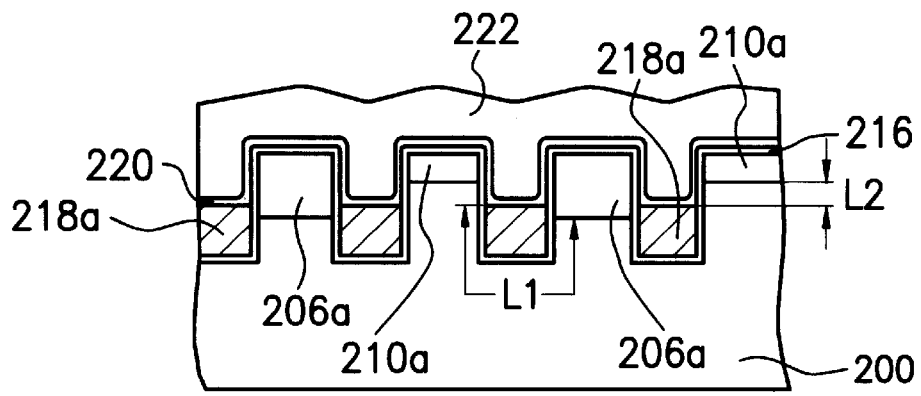

Referring to FIG. 2F. a inter-dielectric layer 220 is formed on the surface of the first polysilicon layer 218a and the tunneling oxide layer 216. The depth of the inter-dielectric layer 220 is, for example, an ONO (oxide/nitride/oxide) layer, wherein the depth of the dielectric layer 220 is 50–400 Å. Next, a second polysilicon layer 222 is further formed on the surface of the inter-dielectric layer 220 and doped using in situ doping procedure. The second polysilicon layer 222 covers the surface of the substrate 200, such that the second poly silicon layer 222 is the controlling gate of the flash memory device. Finally, the second polysilicon layer 222, the inter-dielectric layer 220, and the first polysilicon layer 218a are defined to complete the fabrication of the flash memory device.

This preferred embodiment of the invention can be processed further, just like the prior art. For example, a passivation layer is formed on the device, a contact window is patterned and etched, and so on In accordance with the preferred embodiment of the present invention, the following Table. 1 lists the operating voltages for the flash memory device.

TABLE 1

|  | Controlling Gate | Drain | Source | Substrate |
|---|---|---|---|---|
| Program | 8 V | −8 V | 0 V | −8 V |
| Erase | −8 V | 3 V | 0 V | 0 V |
| Read | 3 V | 0 V | 0 V | 0 V |

When the flash memory device is to be programmed, a negative voltage, for example −8 V, is applied to the drain (second doped region) 210a, the source (first doped region) 206a, and the substrate 200, and a positive high voltage, for example, 8 V is applied to the controlling gate 222. Electrons will flow from the channel region L1 under the tunneling oxide layer 216 towards the floating gate 218a and finish the programming operation.

When the flash memory device is to be erased, a ground potential is applied to the substrate 200, a negative voltage, for example, −8 V, is applied to the controlling gate 222, and a positive voltage, for example 3 V, is applied to the source 206a. Electrons are induced from the floating gate 218a to the source 206a and finish the erasing operation.

Figure 3:
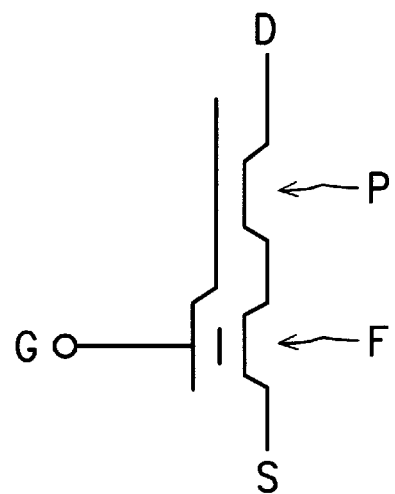
FIG. 3 is a schematic circuit of the flash memory device in accordance with the preferred embodiment.

FIG. 3 is a schematic circuit of the flash memory device shown in FIG. 2F. As shown in FIG. 3, the flash memory device includes a drain D, a source S, and a gate G. The drain D is at a split part P of the flash memory device. The source S is at a floating part F of the flash memory device. A voltage source is applied to the gate G. As a result, the flash memory device is a structure with the split part P. When the flash memory device is to be erased, even if the flash memory device is over-erased to have the floating part F as a depletion-type, the off-state of a channel length L2 will turn the flash memory device off. By doing so, the invention can benefit the flash memory device by freeing it from the influences of the over-erased effect.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a split flash memory device, wherein a substrate is provided, comprising the steps of:

forming a first doped region with first ions in a part of the substrate;

forming a second doped region with second ions in another part of the substrate, wherein the second doped region is shallower than the first doped region;

removing a part of the substrate to form a trench, which is positioned between the first doped region and the second doped region;

forming a tunneling oxide layer along a sidewall of the trench and on the substrate;

forming a first polysilicon layer in the trench, wherein a top surface of the first polysilicon layer is higher than an interface between the first doped region and the substrate, but is lower than an interface between the second doped region and the substrate;

forming an inter-dielectric layer on the substrate and on the first polysilicon layer; and forming a second polysilicon layer over the substrate.

2. A method according to claim 1, wherein the step of forming the first polysilicon layer further comprises:

forming the first polysilicon layer in the trench, wherein a part of the first polysilicon layer covers the substrate; and etching back the first polysilicon layer until the top surface of the first poysilicon layer is lower than the interface between the second doped region and the substrate, but is higher than the interface between the first doped region and the substrate.

3. A method according to claim 1, further comprising a step of driving the first ions further into the substrate by annealing after forming the first doped region in the substrate.

4. A method according to claim 1, wherein the first doped region is a source of the flash memory device.

5. A method according to claim 1, wherein the second doped region is a drain of the flash memory device.

6. A method according to claim 1, wherein the first ions are selected from a group consisting of phosphorus and arsenic.

7. A method according to claim 1, wherein the second ions comprise arsenic.

8. A method according to claim 3, wherein the annealing step is performed for about 10–60 minutes at a temperature of 850° C.–1000° C.

9. A method of fabricating a split gate flash memory device, wherein a substrate is provided, comprising the steps of:

forming a source region in a part of the substrate;

forming a drain region in another part of the substrate, wherein the source region is deeper than the drain region;

removing a part of the substrate to form a trench between the source region and the drain region;

forming a tunneling oxide layer along a sidewall of the trench and on the substrate;

forming a floating gate in the trench, wherein a top surface of the floating gate is lower than an interface between the drain region and the substrate, but is higher than an interface between the source region and the substrate;

forming an inter-dielectric layer on the substrate and on the floating gate; and forming a control gate over the substrate.

10. A method according to claim 9, wherein the tunneling oxide layer is formed by thermal oxidation.

11. A method according to claim 10, wherein the thickness of the tunneling oxide layer is 50–100 Å.

12. A method according to claim 9, wherein the source region have a depth that is deeper than the drain region.

13. A method according to claim 9, wherein the inter-dielectric layer is an ONO layer.

* * * * *